United States Patent
Tanaka et al.

(10) Patent No.: US 9,209,262 B2
(45) Date of Patent: Dec. 8, 2015

(54) SILICON CARBIDE SEMICONDUCTOR DEVICE AND METHOD FOR MANUFACTURING SAME

(71) Applicant: Panasonic Corporation, Osaka (JP)

(72) Inventors: Koutarou Tanaka, Osaka (JP); Masao Uchida, Osaka (JP); Masahiko Niwayama, Kyoto (JP); Osamu Kusumoto, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/377,379

(22) PCT Filed: Dec. 3, 2013

(86) PCT No.: PCT/JP2013/007095
§ 371 (c)(1),
(2) Date: Aug. 7, 2014

(87) PCT Pub. No.: WO2014/103186
PCT Pub. Date: Jul. 3, 2014

(65) Prior Publication Data
US 2015/0303271 A1    Oct. 22, 2015

(30) Foreign Application Priority Data
Dec. 27, 2012   (JP) .................. 2012-285708

(51) Int. Cl.
*H01L 21/22*    (2006.01)
*H01L 23/58*    (2006.01)
(Continued)

(52) U.S. Cl.
CPC ........ *H01L 29/513* (2013.01); *H01L 21/28185* (2013.01); *H01L 21/28202* (2013.01);
(Continued)

(58) Field of Classification Search
CPC ................................. H01L 21/28202
USPC ........... 438/546–549, 528, 554; 257/642–646
See application file for complete search history.

(56) References Cited

U.S. PATENT DOCUMENTS 7,709,403 B2 *   5/2010   Yamashita et al. ............ 438/786
7,820,558 B2 *  10/2010   Ohmi et al. .................... 438/778
(Continued)

FOREIGN PATENT DOCUMENTS

CN    101405849 A    4/2009
CN    102194682 A    9/2011
(Continued)

OTHER PUBLICATIONS

Chinese Search report for corresponding Chinese Application No. 201380010965.2 (with English Translation) dated Jan. 19, 2015.
(Continued)

*Primary Examiner* — Calvin Lee
(74) *Attorney, Agent, or Firm* — Renner, Otto, Boisselle & Sklar, LLP

(57) ABSTRACT

This silicon carbide semiconductor device includes: a silicon carbide semiconductor layer; a gate insulating layer which is arranged over the silicon carbide semiconductor layer and which includes a silicon oxide film; a gate electrode which is arranged on the gate insulating layer; and a carbon transition layer which is interposed between the silicon carbide semiconductor layer and the silicon oxide film and which has a carbon atom concentration is 10% to 90% of a carbon atom concentration of the silicon carbide semiconductor layer. In a region of the carbon transition layer which is located closer to the silicon oxide film than a position where a nitrogen atom concentration becomes the highest is, a ratio of an integral of nitrogen atom concentrations to an integral of carbon atom concentrations is equal to or greater than 0.11.

7 Claims, 7 Drawing Sheets

(51) Int. Cl.
*H01L 29/51* (2006.01)
*H01L 29/10* (2006.01)
*H01L 29/16* (2006.01)
*H01L 29/78* (2006.01)
*H01L 29/66* (2006.01)
*H01L 21/28* (2006.01)

(52) U.S. Cl.
CPC ........ *H01L29/1095* (2013.01); *H01L 29/1608* (2013.01); *H01L 29/517* (2013.01); *H01L 29/518* (2013.01); *H01L 29/66712* (2013.01); *H01L 29/7802* (2013.01)

(56) References Cited

U.S. PATENT DOCUMENTS

| | | | |
|---|---|---|---|
| 8,872,188 | B2 * | 10/2014 | Honaga et al. ............ 257/77 |
| 2004/0185676 | A1 | 9/2004 | Hasegawa |
| 2005/0077569 | A1 | 4/2005 | Yamashita et al. |
| 2007/0215954 | A1 | 9/2007 | Mouli |
| 2008/0135954 | A1 | 6/2008 | Ohmi et al. |
| 2011/0230029 | A1 | 9/2011 | Wang |
| 2012/0009801 | A1 | 1/2012 | Tanioka et al. |
| 2012/0199846 | A1 | 8/2012 | Shimizu et al. |
| 2012/0199850 | A1 | 8/2012 | Honaga et al. |
| 2013/0075756 | A1 | 3/2013 | Arthur et al. |

FOREIGN PATENT DOCUMENTS

| | | |
|---|---|---|
| JP | 2004-253777 A | 9/2004 |
| JP | 2007-180118 A | 6/2007 |
| JP | 2008-147365 A | 6/2008 |
| JP | 2011-082454 A | 4/2011 |
| JP | 2011-165941 A | 8/2011 |
| JP | 2012-038919 A | 2/2012 |
| WO | WO 2010/103820 A1 | 9/2010 |
| WO | WO 2012/135288 A1 | 10/2012 |

OTHER PUBLICATIONS

International Search report for corresponding International Application No. PCT/JP2013/007095 mailed Mar. 4, 2014.

Keiko Fujihara et al., "Characteristics of 4H—SiC MOS interface annealed in N2O" Solid-State Electronics, Apr. 14, 2005, vol. 49, pp. 896-901.

Rajan Arora et al., "Charge Trapping Properties of 3C— and 4H—SiC MOS Capacitors With Nitrided Gate Oxides", IEEE Transactions on Nuclear Science, vol. 56, No. 6, 2009, pp. 3185-3191.

John Rozen et al., "Density of interface states, electron traps, and hole traps as a function of the nitrogen density in SiO2 on SiC", Journal of Applied Physics, vol. 105, Jun. 22, 2009, 124506-1-11.

K.McDonald et al., "Characterization and modeling of the nitrogen passivation of interface traps in SiO2/4H—SiC", Journal of Applied Physics, vol. 93, No. 5, (2003) pp. 2719-2722.

K.Yamashita et al., "SIMS Analyses of SiO2/4H—SiC(0001) Interface", Silicon Carbide and Related Materials 2001, Materials Science Forum vols. 389-393 (2002), pp. 1037-1040.

K.Yamashita et al., "SIMS analyses of SiO2/4H—SiC(0001) interface", Proceedings of the 63th Meeting of The Japan Society of Applied Physics and Related Societies, Sep. 2002, Niigata Univ., 25a-P7-28 and a full English translation.

Y. Liu et al., "Formation and Analysis of the Insulating Layer over Silicon Carbide by a Directly Thermal Nitridation", Proceedings of the 63th Meeting of The Japan Society of Applied Physics and Related Societies, Sep. 2002, Niigata Univ., 25a-P7-29 and a full English translation.

* cited by examiner

SILICON CARBIDE SEMICONDUCTOR DEVICE AND METHOD FOR MANUFACTURING SAME

TECHNICAL FIELD

The present invention relates to a wide bandgap semiconductor device which uses silicon carbide.

BACKGROUND ART

A wide-bandgap semiconductor has a higher breakdown voltage than a silicon semiconductor and can make a huge amount of current flow through it, and therefore, has attracted a lot of attention as a semiconductor material that could be potentially used to make a power device. Among other things, a silicon carbide semiconductor that uses silicon carbide (SiC) has a much higher dielectric breakdown voltage than any other wide-bandgap semiconductor, and therefore, is expected to be the best semiconductor material to make a next-generation low-loss power device. Examples of semiconductor devices that use a silicon carbide semiconductor include a metal-insulator-semiconductor field-effect transistor (MISFET) that is a unipolar switching device. A metal-oxide-semiconductor field-effect transistor (MOSFET) is one of those MISFETs. An SiC-MOSFET has attracted a lot of attention these days as a key semiconductor device which can operate at high speeds and which will contribute to reducing the size and loss of a power unit.

An SiC-MOSFET has a channel mobility which is significantly lower than the theoretical limit, which is problem with the SiC-MOSFET. They believe that an SiC-MOSFET has that low channel mobility because there should be interface states and a lot of other defects in the interface between the silicon carbide semiconductor and a silicon dioxide ($SiO_2$) film. Thus, to reduce the number of those defects in the interface between the oxide film and the silicon carbide semiconductor, someone proposed that a nitridation process be performed after an oxide film has been formed by either thermal oxidation or chemical vapor deposition (CVD) process. By heavily doping the interface between an oxide film and a silicon carbide semiconductor with nitrogen, the density of those interface states should be reduced and the channel mobility should be increased. For example, Non-Patent Document No. 1 discloses that a heat treatment is carried out at 1175° C. for two hours within a nitrogen gas to introduce nitrogen into the interface between the silicon oxide film and the silicon carbide semiconductor at an area concentration of $2 \times 10^{14}$ $cm^{-2}$ or more.

Meanwhile, Patent Document No. 1, for example, discloses that when a negative bias is applied to the gate electrode of an SiC-MOSFET in OFF state, its threshold voltage (Vth) will vary with time (more specifically, will shift in the negative direction). Patent Document No. 1 says that such a phenomenon could be produced, because holes (which are positive electric charges) would gradually get caught in hole traps that should be present at a high density in the vicinity of the interface between the silicon oxide film and the silicon carbide semiconductor. Patent Document No. 1 also proposes that in order to suppress such a variation, the concentration of nitrogen atoms in the interface between the silicon carbide semiconductor and the silicon oxide film be set to be lower (at less than $1.6 \times 10^{11}$ $cm^{-2}$) than in Non-Patent Document No. 1.

It should be noted that it is known that even in a p-channel MOSFET which uses a silicon (Si) semiconductor, when a negative bias is applied to its gate electrode, its threshold voltage will also vary (which is called an NBTI (negative bias temperature instability)). The variation in threshold voltage will be 0.1 V or less under a stress voltage applied for a long time (e.g., 1000 h). However, they say that this phenomenon would be produced by the movement of carriers into and out of interface states due to the presence of dangling bonds of Si (see Patent Document No. 2, for example), which is quite different from the cause of the phenomenon to be observed in the SiC-MOSFET.

CITATION LIST

Patent Literature

Patent Document No. 1: Japanese Laid-Open Patent Publication No. 2011-82454
Patent Document No. 2: Japanese Laid-Open Patent Publication No. 2004-253777

Non-Patent Literature

Non-Patent Document No. 1: J. Appl. Phys., Vol. 93, No. 5, 2003, p. 2719

SUMMARY OF INVENTION

Technical Problem

However, the present inventors discovered that even when a positive bias was applied to the gate electrode of an SiC-MOSFET, the threshold voltage could also vary. In some cases, the variation in threshold voltage upon the application of a positive bias could be very large (e.g., on the order of a few 10 mV to a few V).

The present inventors also discovered via intensive experiments that such a variation in threshold value upon the application of a positive bias was brought about by a totally different mechanism and due to a quite different factor from the variation in threshold value upon the application of negative bias described above. The results of those experiments carried out by the present inventors will be described later. Consequently, it is difficult to sufficiently suppress the variation in threshold value upon the application of a positive bias by the same means as the conventional one.

Thus, taking these circumstances into consideration, an embodiment of the present invention provides a silicon carbide semiconductor device which can suppress such a variation in threshold value to be caused by applying a positive bias to the gate electrode.

Solution to Problem

A silicon carbide semiconductor device according to an embodiment of the present invention includes: a silicon carbide semiconductor layer; a gate insulating layer which is arranged over the silicon carbide semiconductor layer and which includes a silicon oxide film; a gate electrode which is arranged on the gate insulating layer; and a carbon transition layer which is interposed between the silicon carbide semiconductor layer and the silicon oxide film and which has a carbon atom concentration is 10% to 90% of a carbon atom concentration of the silicon carbide semiconductor layer. In a region of the carbon transition layer which is located closer to the silicon oxide film than a position where a nitrogen atom concentration becomes the highest is, a ratio of an integral of nitrogen atom concentrations to an integral of carbon atom concentrations is equal to or greater than 0.11.

A method for fabricating a silicon carbide semiconductor device according to an embodiment of the present invention includes the steps of: (a) providing a silicon carbide semiconductor layer; (b) forming a gate insulating layer including a silicon oxide film on the surface of the silicon carbide semiconductor layer, whereby a carbon transition layer, which has a carbon atom concentration is 10% to 90% of a carbon atom concentration of the silicon carbide semiconductor layer, is formed between the silicon carbide semiconductor layer and the silicon oxide film; and (c) introducing nitrogen atoms into at least the carbon transition layer, whereby in a region of the carbon transition layer which is located closer to the silicon oxide film than a position where a nitrogen atom concentration reaches its peak is, a ratio of an integral of nitrogen atom concentrations to an integral of carbon atom concentrations is equal to or greater than 0.11.

Advantageous Effects of Invention

According to an embodiment of the present invention, a variation in threshold value to be caused in a silicon carbide semiconductor device by applying a positive bias to its gate electrode can be suppressed.

DESCRIPTION OF EMBODIMENTS

Figure 1:
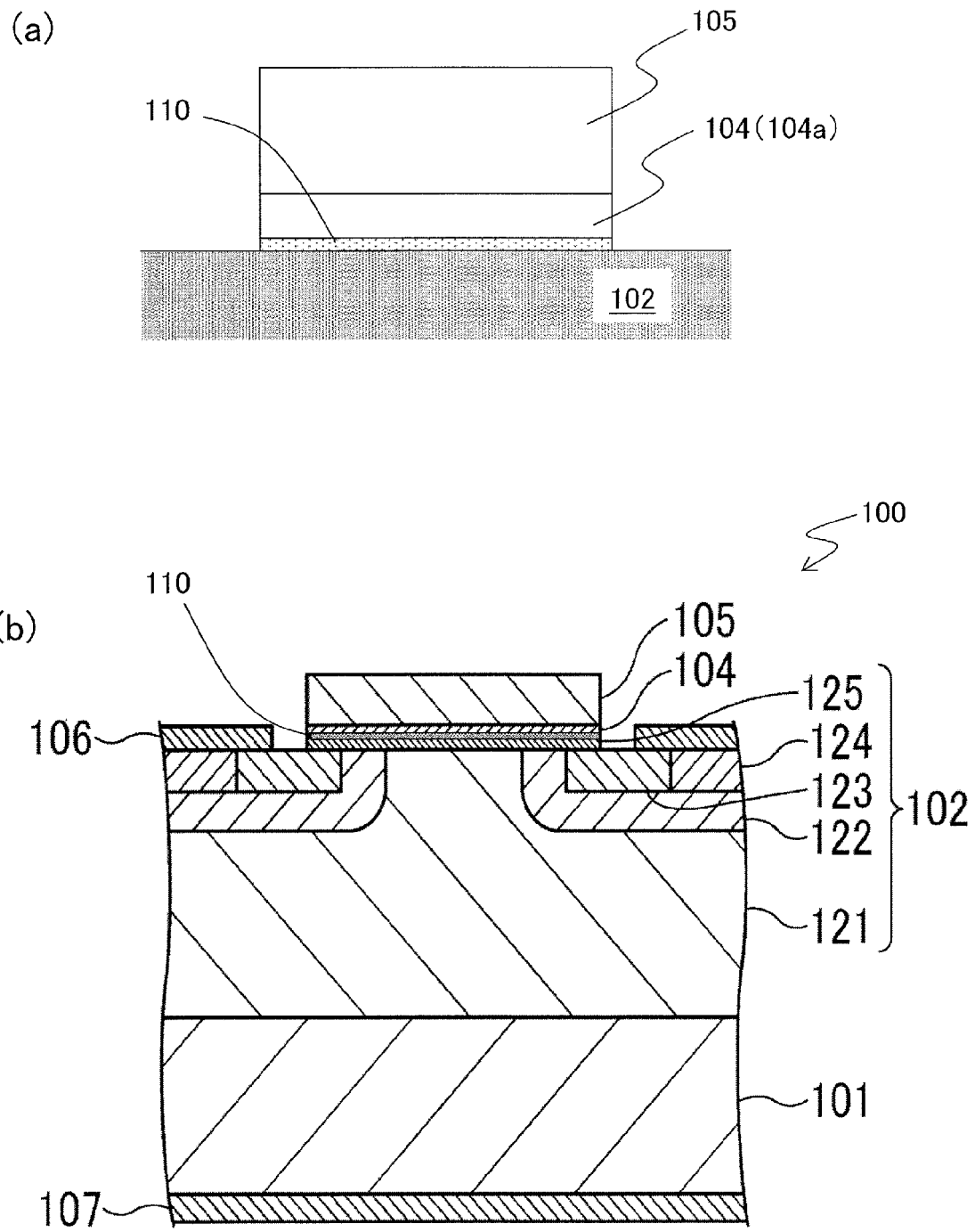
[FIG. 1] (a) is a partial cross-sectional view illustrating the MOS structure of a silicon carbide semiconductor device according to an embodiment of the present invention and (b) is a cross-sectional view illustrating an exemplary silicon carbide semiconductor device (vertical MOSFET) 100 according to the embodiment.

As described above, the present inventors looked into the mechanism that would cause a shift in threshold voltage upon the application of a positive bias to an SiC-MOSFET. In this description, the "shift in threshold value upon the application of a positive bias to a gate electrode" means that the threshold value Vth2 after a positive bias has been applied to the gate electrode is different from the threshold value Vth1 before the positive bias is applied to the gate electrode. Also, the difference (Vth2−Vth1) between these threshold voltages will be referred to herein as a threshold voltage shift ΔVth (V).

As a result of the researches, the present inventors discovered that when a positive bias was applied to the gate electrode, the threshold value varied due to at least two factors, one of which was residual carbon atoms remaining between the silicon oxide film and the SiC semiconductor layer. This is a phenomenon uniquely observed in SiC.

In an SiC-MOSFET, a gate oxide film (thermal oxide film) is sometimes formed by thermally oxidizing the surface of an SiC semiconductor layer. Through the thermal oxidation, silicon atoms in the SiC semiconductor layer will bond to oxygen to turn into $SiO_2$ ($Si+O_2 \rightarrow SiO_2$), while carbon atoms will bond to oxygen to sublime as COn ($C+nO \rightarrow CO_n$). However, some carbon atoms will not sublime but remain in the vicinity of the interface between the SiC semiconductor layer and the gate oxide film (i.e., around the $SiC/SiO_2$ interface). The present inventors confirmed via experiments that those remaining carbon atoms (which will be referred to herein as "residual carbon atoms") had a concentration of at least $1.0 \times 10^{19}$ cm$^{-3}$ in a region with a thickness of several nm including the $SiC/SiO_2$ interface. And the present inventors presumed that the threshold voltage varied significantly due to the presence of defect levels (or traps) resulting from those residual carbon atoms in that region. We also discovered that the threshold value varied due to the presence of those residual carbon atoms mostly during the interval between a point in time when the positive bias just started to be applied to the gate electrode and a point in time when a short time passed since then (e.g., within 300 seconds). In this description, a shift in threshold value to be caused when the accumulated time of application of a voltage to the gate electrode is relatively short will be referred to herein as an "initial shift". The present inventors further discovered that the thickness of the region where there were those residual carbon atoms in the vicinity of the $SiC/SiO_2$ interface and the number of the residual carbon atoms were not constant but varied according to the oxidation rate during the thermal oxidation process and the thickness of the thermal oxide film.

Based on these results of researches, the present inventors discovered that the shift in threshold voltage due to the presence of those residual carbon atoms could be reduced by taking advantage of the effect of replacing or terminating the residual carbon atoms with nitrogen atoms, thus perfecting our invention.

An embodiment of the present invention can be outlined as follows.

A silicon carbide semiconductor device according to an embodiment of the present invention includes: a silicon carbide semiconductor layer; a gate insulating layer which is arranged over the silicon carbide semiconductor layer and which includes a silicon oxide film; a gate electrode which is arranged on the gate insulating layer; and a carbon transition layer which is interposed between the silicon carbide semiconductor layer and the silicon oxide film and of which the carbon atom concentration is 10% to 90% of the carbon atom concentration of the silicon carbide semiconductor layer. In a region of the carbon transition layer which is located closer to the silicon oxide film than a position where a nitrogen atom concentration becomes the highest is, the ratio of the integral of nitrogen atom concentrations to the integral of carbon atom concentrations is equal to or greater than 0.11.

The silicon carbide semiconductor device may further include a substrate which supports the silicon carbide semiconductor layer, a drain electrode which is arranged on the other side of the substrate opposite from the silicon carbide semiconductor layer, and a source electrode which is arranged on the silicon carbide semiconductor layer. The silicon carbide semiconductor layer includes: a drift region of a first conductivity type; a body region of a second conductivity type which is arranged adjacent to the drift region; a doped region of the first conductivity type which is arranged in the body region; and a channel layer which is arranged between the body region and the gate insulating layer so as to connect the drift region and the doped region together. The source electrode may be electrically connected to the doped region. And the carbon transition layer may be located between the channel layer and the silicon oxide film.

The silicon carbide semiconductor device may further include a substrate which supports the silicon carbide semiconductor layer, and source and drain electrodes which are arranged on the silicon carbide semiconductor layer. The silicon carbide semiconductor layer may include: a drift region of a first conductivity type; a body region of a second conductivity type which is arranged adjacent to the drift region; first and second doped regions of the first conductivity type which are arranged in the body region so as to be spaced part from each other; and a channel layer which is arranged between the body region and the gate insulating layer so as to connect the first and second doped regions together. The source and drain electrodes may be electrically connected to the first and second doped regions, respectively. And the carbon transition layer may be located between the channel layer and the silicon oxide film.

A depth direction profile of the nitrogen atom concentration may have a peak in the carbon transition layer.

A method for fabricating a silicon carbide semiconductor device according to an embodiment of the present invention includes the steps of: (a) providing a silicon carbide semiconductor layer; (b) forming a gate insulating layer including a silicon oxide film on the surface of the silicon carbide semiconductor layer, whereby a carbon transition layer, of which the carbon atom concentration is 10% to 90% of the carbon atom concentration of the silicon carbide semiconductor layer, is formed between the silicon carbide semiconductor layer and the silicon oxide film; and (c) introducing nitrogen atoms into at least the carbon transition layer, whereby in a region of the carbon transition layer which is located closer to the silicon oxide film than a position where a nitrogen atom concentration reaches its peak is, the ratio of the integral of nitrogen atom concentrations to the integral of carbon atom concentrations is equal to or greater than 0.11.

The step (b) may include forming the silicon oxide film by thermally oxidizing the surface of the silicon carbide semiconductor layer.

The step (c) may include conducting a heat treatment at a temperature of at least 1200° C. within an ambient including nitrogen on the silicon carbide semiconductor layer on which the gate insulating layer has been formed.

As described above, according to an embodiment of the present invention, nitrogen is introduced into a region where there are residual carbon atoms in the vicinity of the $SiC/SiO_2$ interface with the quantity of nitrogen determined appropriately according to the number of those residual carbon atoms. In this manner, the initial shift to be caused by those residual carbon atoms can be suppressed. In this description, the "vicinity of the $SiC/SiO_2$ interface" refers herein to a layer with a predetermined thickness between the silicon carbide layer and the silicon oxide film. If the silicon carbide layer, the silicon oxide film and the carbon transition layer located between them are defined by the concentration of carbon atoms as will be described later, that layer with the predetermined thickness corresponds to the carbon transition layer.

It should be noted that in a MOSFET which uses a silicon semiconductor (i.e., Si-MOSFET), for example, there are no residual carbon atoms in the first place, and therefore, no variation in threshold voltage can ever be caused by residual carbon atoms. In addition, it is difficult to suppress the initial shift to be caused when a positive bias is applied to the gate electrode by a conventional method for reducing a shift in the threshold value of an SiC-MOSFET. For example, even though Patent Document No. 1 and Non-Patent Document No. 1 teach performing a nitridation process, they don't understand that the shift in threshold value upon the application of a positive bias to the gate electrode is caused by residual carbon atoms and do not mention at all the relation between the respective concentrations of carbon atoms and nitrogen atoms in the carbon transition layer.

Hereinafter, embodiments of the present invention will be described more specifically with reference to the accompanying drawings. In the following description, any pair of components shown in multiple drawings and having substantially the same function will be identified by the same reference numeral. And once such a component has been described, the description of its counterpart will be omitted herein to avoid redundancies. It should be noted that those components on the drawings are illustrated just schematically and do not always have to have the illustrated shapes.

FIG. 1(a) is a partial cross-sectional view illustrating a silicon carbide semiconductor device according to an embodiment. The silicon carbide semiconductor device of this embodiment includes a silicon carbide semiconductor layer 102, a gate insulating layer 104 which is arranged on the silicon carbide semiconductor layer 102 and which includes a silicon oxide film ($SiO_2$ film) 104a, and a gate electrode 105 which is arranged on the gate insulating layer 104. Such a structure including the silicon carbide semiconductor layer 102, the gate insulating layer 104 and the gate electrode 105 will be sometimes referred to herein as an "MOS structure".

In addition, there is another layer 110, of which the carbon atom concentration is 10% to 90% of that of the silicon carbide semiconductor layer 102, between the silicon carbide semiconductor layer 102 and the silicon oxide film 104a. In this description, such a layer 110 will be referred to herein as a "carbon transition layer". The carbon transition layer 110 includes nitrogen atoms. In this embodiment, in a region which is located closer to the silicon oxide film 104a than a position in the carbon transition layer 110 where a nitrogen atom concentration becomes the highest is (and will be referred to herein as an "atomic concentration integration region"), the ratio R of the integral of nitrogen atom concentrations to the integral of carbon atom concentrations is equal to or greater than 0.11.

Figure 2:
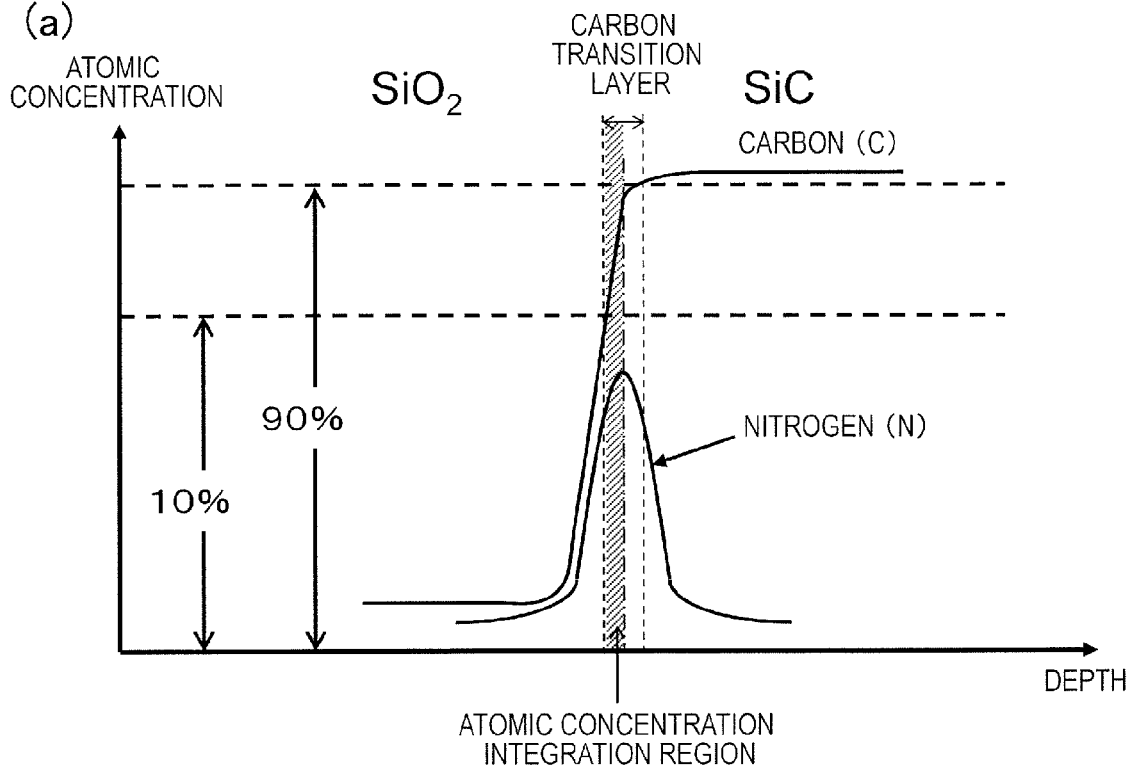
[FIG. 2] (a) and (b) schematically illustrate a carbon transition layer in the vicinity of an $SiO_2$/SiC interface.
Figure 2:
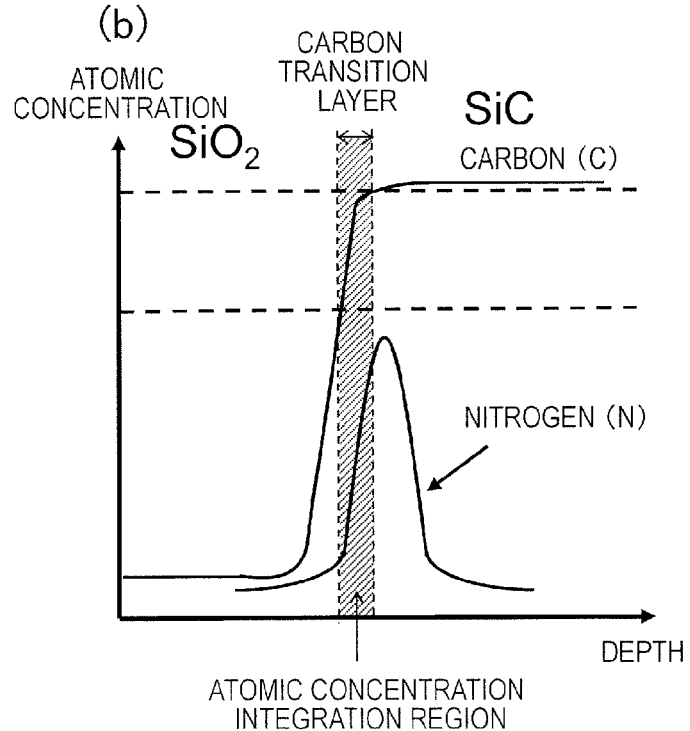

FIG. 2(a) is a graph showing exemplary concentration profiles of carbon atoms and nitrogen atoms in the depth direction under the surface of the silicon oxide film 104a to illustrate a carbon transition layer 110 according to this embodiment.

In the example shown in FIG. 2(a), the carbon atom concentration decreases from the silicon carbide semiconductor layer 102 toward the silicon oxide film 104a, and a region in which the ratio of its carbon atom concentration to that of the silicon carbide semiconductor layer 102 changes from 90% to 10% becomes the carbon transition layer 110. If the silicon oxide film 104a is formed by thermally oxidizing the surface of the silicon carbide semiconductor layer 102, the carbon transition layer 110 includes carbon atoms which have not sublimed but remained (i.e., the residual carbon atoms) during the thermal oxidation process. The thickness of the carbon transition layer 110 varies depending on the method or condition of forming the silicon oxide film 104a but may fall within the range of 0.5 nm to 3 nm, for example. If the silicon oxide film 104a is formed by thermal oxidation, the carbon transition layer 110 tends to be thicker than in a situation where the silicon oxide film 104a is formed by CVD process, and may have a thickness of 0.5 nm to 5 nm, for example.

Nitrogen atoms have been introduced into the carbon transition layer 110. In the example illustrated in FIG. 2, the nitrogen atom concentration profile has a peak in the carbon transition layer 110. That is why the region 104b of the carbon transition layer 110 which is located closer to the silicon oxide film 104a than a depth at which the nitrogen atom concentration profile reaches its peak is becomes the atomic concentration integration region. In this region, the ratio R of the integral of the nitrogen atom concentrations to the integral of the carbon atom concentrations may be equal to or greater than 0.11. If the peak of the nitrogen atom concentration profile is located in the carbon transition layer 110 in this manner, the nitrogen atoms can be introduced into the carbon transition layer 110 more efficiently. As a result, the effect can be achieved even more significantly.

It should be noted that the peak of the nitrogen atom concentration profile does not have to be inside the carbon transition layer 110. In that case, the region 104b of the carbon transition layer 110 which is located closer to the silicon oxide film 104a than a depth at which the nitrogen atom concentration becomes the highest is becomes the atomic concentration integration region. That is why if the peak of the nitrogen atom concentration profile is located under the depth of the interface between the silicon oxide film 104a and the carbon transition layer 110 (i.e., the depth at which the carbon atom concentration becomes 10%), the atomic concentration integration region can be determined. For example, if the peak of the nitrogen atom concentration profile is located inside the silicon carbide semiconductor layer 102 as shown in FIG. 2(b), the entire carbon transition layer 110 becomes the atomic concentration integration region 104b. Alternatively, the nitrogen atom concentration profile may also have a flat portion with no acute peaks. If the flat portion includes the maximum value of the nitrogen atom concentration of the carbon transition layer 110, then a region 104b between a point in the flat portion that is closest to the silicon oxide film 104a and the silicon oxide film 104a becomes the atomic concentration integration region.

According to this embodiment, nitrogen atoms, of which the quantity is equal to or greater than a predetermined percentage of that of the carbon atoms, are included in the carbon transition layer 110 that is a region including residual carbon atoms. That is why the shift in threshold value to be caused by the residual carbon atoms when a positive bias is applied to the gate electrode 105 can be reduced. The reason will be described later with reference to results of the experiments.

Hereinafter, the structure of the silicon carbide semiconductor device according to this embodiment will be described more specifically as being implemented as a vertical MOSFET, for example.

FIG. 1(b) is a cross-sectional view illustrating an exemplary silicon carbide semiconductor device (vertical MOSFET) 100 according to this embodiment. The vertical MOSFET 100 includes a plurality of unit cells, just one of which is illustrated in FIG. 1(b).

Each unit cell of this silicon carbide semiconductor device 100 includes a substrate 101, an MOS structure including a silicon carbide semiconductor layer 102, a carbon transition layer 110, a gate insulating layer 104 and a gate electrode 105 that have been stacked one upon the other in this order on the principal surface of substrate 101, a source electrode 106 arranged on the silicon carbide semiconductor layer 102, and a drain electrode 107 arranged on the back surface (i.e., opposite from the principal surface) of the substrate 101. The MOS structure has the same structure as what has already been described with reference to FIG. 1(a).

The substrate 101 may be a low-resistance silicon carbide substrate of a first conductivity type (e.g., $n^+$-type in this embodiment).

The gate insulating layer 104 may be a silicon oxide film 104a, for example. It should be noted that the gate insulating layer 104 just needs to include a silicon oxide film 104a and another insulating film may be interposed between the silicon oxide film 104a and the gate electrode 105.

The silicon carbide semiconductor layer 102 has a body region 122 of a second conductivity type (i.e., p-type in this example) which is different from the first conductivity type, a drift region 121 of the first conductivity type which is the rest of the silicon carbide semiconductor layer 102 other than the body region 122, and a channel layer 125 which is arranged between the body region 122 and the gate insulating layer 104. More specifically, the drift region 121 is arranged adjacent to the body region 122 and is an $n^-$-type silicon carbide semiconductor region including an n-type dopant, of which the concentration is lower than in the substrate 101. Inside the body region 122, arranged is a doped region (source region) 123 which is heavily doped with a dopant of the first conductivity type (e.g., $n^+$-type in this example). The doped region 123 contacts with the source electrode 106. Optionally, a contact region 124 which is doped more heavily than the body region 122 with a dopant of the second conductivity type (e.g., $p^+$-type in this example) may be arranged inside the body region 122. The contact region 124 is arranged to contact with the source electrode 106. Consequently, the body region 122 is electrically connected to the source electrode 106 via the contact region 124.

The channel layer 125 is arranged over the body region 122 so as to connect the drift region 121 and the doped region 123 together. The channel layer 125 may be a silicon carbide layer of the first conductivity type (e.g., n-type in this embodiment), for example. In this example, the channel layer 125 is arranged to extend from over the body region 122 and the source region 123 that is located inside the body region 122 through the adjacent body region 122 and the source region 123 that is located inside the body region 122 and to run across the drift region 121 that is located between those two body regions 122. A portion of the channel layer 125 which is located over the body region 122 functions as a channel through which carriers move.

The silicon carbide semiconductor layer 102 may include a silicon carbide epitaxial layer which has been grown epitaxially (to a thickness of 10 μm, for example) on the substrate 101 and a channel layer 125 which has been formed on the silicon carbide epitaxial layer. In that case, the body region 122, the drift region 121 and the contact region 124 may be defined in the silicon carbide epitaxial layer. Likewise, the channel layer 125 may also have been grown epitaxially on the silicon carbide epitaxial layer.

In this silicon carbide semiconductor device 100, by applying a voltage to the gate electrode 105, current can flow through the channel layer 125 under the gate electrode 105. Thus, current running from the drain electrode 107 (i.e., drain current) flows through the substrate 101, the drift region 121, the channel layer 125, and the source region 123 into the source electrode 106 (in ON state).

The substrate 101 of this embodiment suitably includes an n-type dopant at a concentration of $1 \times 10^{18}$ cm$^{-3}$ or more, for example. The n-type dopant to be introduced into the substrate 101 is suitably nitrogen, phosphorus or arsenic, for example. The drift region 121 may be doped with an n-type dopant at a dose of about $1 \times 10^{11}$ cm$^{-3}$ to $1 \times 10^{16}$ cm$^{-3}$ and the doped region 123 may be doped with an n-type dopant at a dose of about $1 \times 10^{19}$ cm$^3$ to $1 \times 10^{21}$ cm$^{-3}$. In that case, the n-type dopant may be nitrogen. The channel layer 125 may include an n-type dopant such as nitrogen, phosphorus or antimony at a very small percentage. The body region 122 may include a p-type dopant at a concentration of about $1 \times 10^{16}$ cm$^{-3}$ to $2 \times 10^{19}$ cm$^{-3}$ and the contact region 124 may include a p-type dopant at a concentration of about $5 \times 10^{19}$ cm$^{-3}$. The p-type dopant concentration in the body region 122 is suitably $1 \times 10^{17}$ cm$^{-3}$ or more.

Although not shown, if necessary, an interlevel dielectric film may be formed to cover the gate electrode 105 and the source electrode 106, and an interconnect which is connected to the gate electrode 105 and source electrode 106 may be formed through the interlevel dielectric film. Also, although the source electrode 106 is arranged to contact with both the source region 123 and the contact region 124 in this example, the source electrode 106 does not have to contact with the contact region 124. In that case, a contact electrode may be formed on the contact region 124 and the source electrode 106 and the contact electrode may be connected together with an interconnect, for example. The contact region 124 just needs to be arranged in the body region 122 and does not have to contact with the source region 123.

In this silicon carbide semiconductor device 100, the carbon transition layer 110 is also interposed between the silicon carbide semiconductor layer 102 (i.e., the channel layer 125 in this example) and the silicon oxide film 104 as already described with reference to FIG. 1(a). In a region of the carbon transition layer 110 which is located closer to the silicon oxide film 104a than a position where a nitrogen atom concentration becomes the highest is (i.e., in the atomic concentration integration region), the ratio R of the integral of nitrogen atom concentrations to that of carbon atom concentrations is equal to or greater than 0.11. By setting the ratio R of the nitrogen atom concentration within this range, not only the interface state density but also the shift in threshold value when a positive bias is applied to the gate electrode 105 can be reduced as well.

<Method of Calculating Nitrogen Atom Concentration Ratio R>

The ratio R of the integral of nitrogen atom concentrations to that of carbon atom concentrations may be calculated in the following manner, for example.

Figure 3:
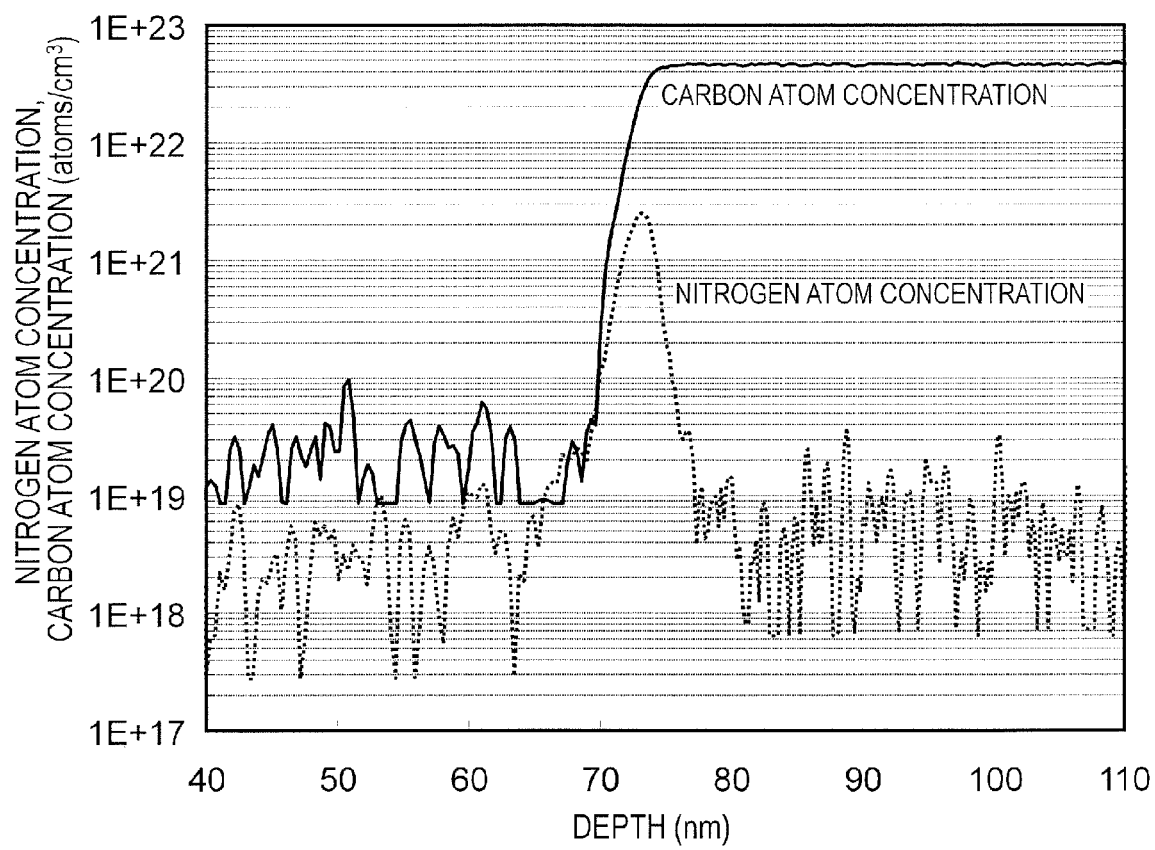
[FIG. 3] A graph showing exemplary thickness direction concentration profiles of carbon and nitrogen atoms.

First of all, the carbon atom concentration and nitrogen atom concentration in the vicinity of the interface between the silicon oxide film 104a and the silicon carbide semiconductor layer 102 are measured by secondary ion mass spectroscopy (SIMS). FIG. 3 is a graph showing exemplary depth direction concentration profiles of carbon and nitrogen atoms that were obtained by SIMS. In this graph, the abscissa represents the depth as measured from the surface of the silicon oxide film 104a.

Next, a depth at which the carbon atom concentration becomes 10% to 90% of the carbon atom concentration of the silicon carbide semiconductor layer 102 is detected to define the carbon transition layer 110 (see FIGS. 2(a) and 2(b)). Subsequently, a depth at which the nitrogen atom concentration becomes maximum in the carbon transition layer 110 is detected to define the atomic concentration integration region.

Thereafter, the integral of the carbon atom concentrations and the integral of the nitrogen atom concentrations are calculated in the atomic concentration integration region. The integrals thus obtained can be evaluated as an area nitrogen atom concentration (in atoms/cm$^2$) and as an area carbon atom concentration (in atoms/cm$^2$) with the dimension in the depth direction ignored.

By calculating the integral of concentrations in the depth direction and by using the area concentration that ignores the dimension in the depth direction as a concentration index, the influence of the resolution precision in the depth direction can be reduced.

<Method for Fabricating Silicon Carbide Semiconductor Device 100>

Hereinafter, an exemplary method for fabricating the silicon carbide semiconductor device 100 will be described.

First of all, an n-type silicon carbide epitaxial layer is grown epitaxially on a substrate 101. The dopant concentration of the silicon carbide epitaxial layer can be controlled by adding a dopant (such as nitrogen) gas during the epitaxial growth.

Next, by implanting p-type dopant ions (e.g., Al (aluminum) ions in this example) into the silicon carbide epitaxial layer, a plurality of body regions 122 are formed in the silicon carbide epitaxial layer. The rest of the silicon carbide epitaxial layer other than those body regions 122 becomes an n-type drift region.

Subsequently, by implanting n-type dopant ions (e.g., N (nitrogen) ions in this example) into the body regions 122, a source region 123 is formed. Also, by implanting p-type dopant ions (Al ions) into the body regions 122, a contact region 124 is formed.

Thereafter, to activate the dopant ions that have been implanted into the silicon carbide epitaxial layer, an annealing process (activating annealing process) is carried out. The activating annealing process may be carried out at an temperature of 1700° C. for 30 minutes within an Ar ambient, for example.

Next, silicon carbide is further grown epitaxially on the silicon carbide epitaxial layer to form a channel layer 125. In this manner, a silicon carbide semiconductor layer 102 is obtained.

The channel layer 125 is an n-type layer and may have a dopant concentration of $1 \times 10^{15}$ cm$^{-3}$ and a thickness of approximately 100 nm, for example. The dopant concentration of the channel layer 125 can be controlled by adding a dopant (such as nitrogen) gas during the epitaxial growth. The thickness of the channel layer 125 will decrease when a gate insulating layer is formed later. It should be noted that even if the channel layer 125 includes nitrogen as an n-type dopant, its nitrogen concentration may be approximately $2 \times 10^{19}$ cm$^{-3}$. That is why the concentration of nitrogen included in a region where the gate insulating layer will be formed through thermal oxidation in a subsequent process step is less than the lower limit of detection by SIMS and is much lower than the dose of nitrogen with which this region will be doped later through the nitridation process to be described later.

Next, by thermally oxidizing a surface portion of the channel layer 125, a silicon oxide film 104a is formed as a gate insulating layer 104 on the channel layer 125. The thermal oxidation can be carried out at a temperature of approximately 1100 to 1250° C. within a dry oxygen ambient, for example. The process time can be adjusted appropriately so that a thermal oxide film (i.e., the silicon oxide film 104a) with an intended thickness can be obtained. Optionally, during the thermal oxidation, some dilute gas such as nitrogen gas or argon gas may be added to the oxygen ambient. In this example, a silicon oxide film 104a with a thickness of 70 nm is formed at a temperature of 1200° C. within a dry oxygen ambient. If a silicon oxide film 104a with a thickness of 70 nm is formed, for example, the surface portion of the channel layer 125 will be consumed to approximately 30 nm by the thermal oxidation.

As a result of this process step, the silicon atoms in the silicon carbide semiconductor layer 102 (that functions as the channel layer 125 in this example) turn into silicon oxide and carbon atoms in the silicon carbide semiconductor layer 102 sublime as COn. However, some carbon atoms do not sublime but are left as residual carbon atoms between the silicon carbide semiconductor layer 102 and the silicon oxide film 104a to be formed by thermal oxidation. In this manner, a carbon transition layer 110 including the residual carbon atoms is formed.

It should be noted that the silicon oxide film 104a does not have to be formed by thermal oxidation but may also be formed by pyrogenic oxidation, chemical vapor deposition (CVD) or any other suitable method. Even if such a non-thermal-oxidation method is adopted, the carbon transition layer 110 will still be formed. If thermal oxidation is adopted, however, more residual carbon atoms will be left than in a situation where any other method is adopted, and therefore, the shift in threshold value due to the presence of those residual carbon atoms can be suppressed even more effectively according to the present invention.

Subsequently, nitrogen is introduced from over the silicon oxide film 104a into at least the carbon transition layer 110 (by nitridation process). This nitrogen doping process may be carried out at a temperature of 1200° C. or more within nitrogen monoxide (NO) ambient, for example. The nitridation process temperature and time can be adjusted appropriately so that nitrogen is introduced at an intended dose into the carbon transition layer 110. The processing ambient does not have to be the nitrogen monoxide ambient but may also be any of various nitrogen-including gases. When the nitrogen doping process is performed, carbon monoxide is suitably diluted with nitrogen so as to avoid decomposing carbon monoxide excessively.

Next, a gate electrode 105 is formed on the gate insulating layer 104. The gate electrode 105 may be formed by depositing and patterning a polysilicon film that is doped with an n-type dopant. If a gate electrode 105 is formed out of a polysilicon film, a silicide layer may be provided over the gate electrode 105.

Thereafter, a source electrode 106 and a drain electrode are formed. The source electrode 106 may be formed by depositing an Ni film in contact with the source region 123 and the contact region 124 and then turning SiC and Ni into an alloy through a heat treatment. The source electrode 106 thus obtained includes nickel silicide and makes an ohmic contact with the source region 123 and the contact region 124. In the same way, the drain electrode 107 may also be formed by depositing Ni on the back surface of the substrate 101 and turning SiC in the substrate 101 and Ni into an alloy.

EXAMPLES

Six SiC-MOSFETs were made as Samples A through F to be evaluated with the nitridation process condition changed and the shift in their threshold voltage were evaluated. Hereinafter, the method and results of the evaluation will be described.

<How to Make Samples>

To make these Samples A through F, a silicon carbide substrate, of which the poly-type was 4H and the off-axis angle was 4 degrees, was used. Also, in these samples, a silicon oxide film (with a thickness of 70 nm) was formed by thermally oxidizing the surface of a silicon carbide semiconductor layer (channel layer). The thermal oxidation was carried out at a temperature of 1200° C. within a dry oxygen ambient. A nitridation process was carried out within a nitrogen monoxide ambient with nitrogen introduced from over the silicon oxide film. More specifically, a heat treatment was carried out with nitrogen monoxide and nitrogen introduced at flow rates of 1 slm and 4 slm (where slm is L/min at 0° C. and 101.3 kPa), respectively, into the chamber at the atmospheric pressure. The nitridation process condition (temperature and time) was changed one sample to another. The following Table 1 shows the temperatures of those Samples A through F when nitrogen was introduced thereto and how long nitrogen was introduced thereto. Vertical MOSFETs with the configuration shown in FIG. 1(b) were made as these Samples A through F under the same process condition except the nitridation process condition.

TABLE 1

| | NO treatment | |
|---|---|---|
| | Temperature (° C.) | Time (h) |
| A | 1100 | 0.5 |
| B | 1150 | 1 |
| C | 1200 | 2 |
| D | 1200 | 4 |
| E | 1200 | 6 |
| F | 1200 | 8 |

<How to Evaluate Samples>

Next, the shifts ΔVth in the threshold voltage Vth of those Samples A through F were estimated. ΔVth was supposed to be the difference between Vth2 after a predetermined voltage had been applied to the gate electrode and Vth1 before the voltage was applied thereto.

First of all, a sample to evaluate (i.e., a MOSFET) was loaded with the heater temperature set to be 150° C. and a threshold voltage Vth1 in the initial state was measured before a voltage was applied to the gate electrode. In this example, the voltage applied to the gate electrode was increased gradually with the drain-source voltage Vds set to be 10 V and Vth1 was supposed to be the gate-source voltage Vgs when the drain current Id became 1 mA. After Vth1 in the initial state had been measured, Vds was set to be 0 V without changing the heater temperature and a voltage of +20 V was applied as a stress voltage to the gate electrode. After a predetermined amount of time had passed, the voltage stopped being applied to the gate electrode and Vth was measured again at 150° C. as Vth2 after the voltage had been applied. Then, the difference between Vth2 after the voltage had been applied and Vth1 in the initial state was obtained as ΔVth.

Figure 4:
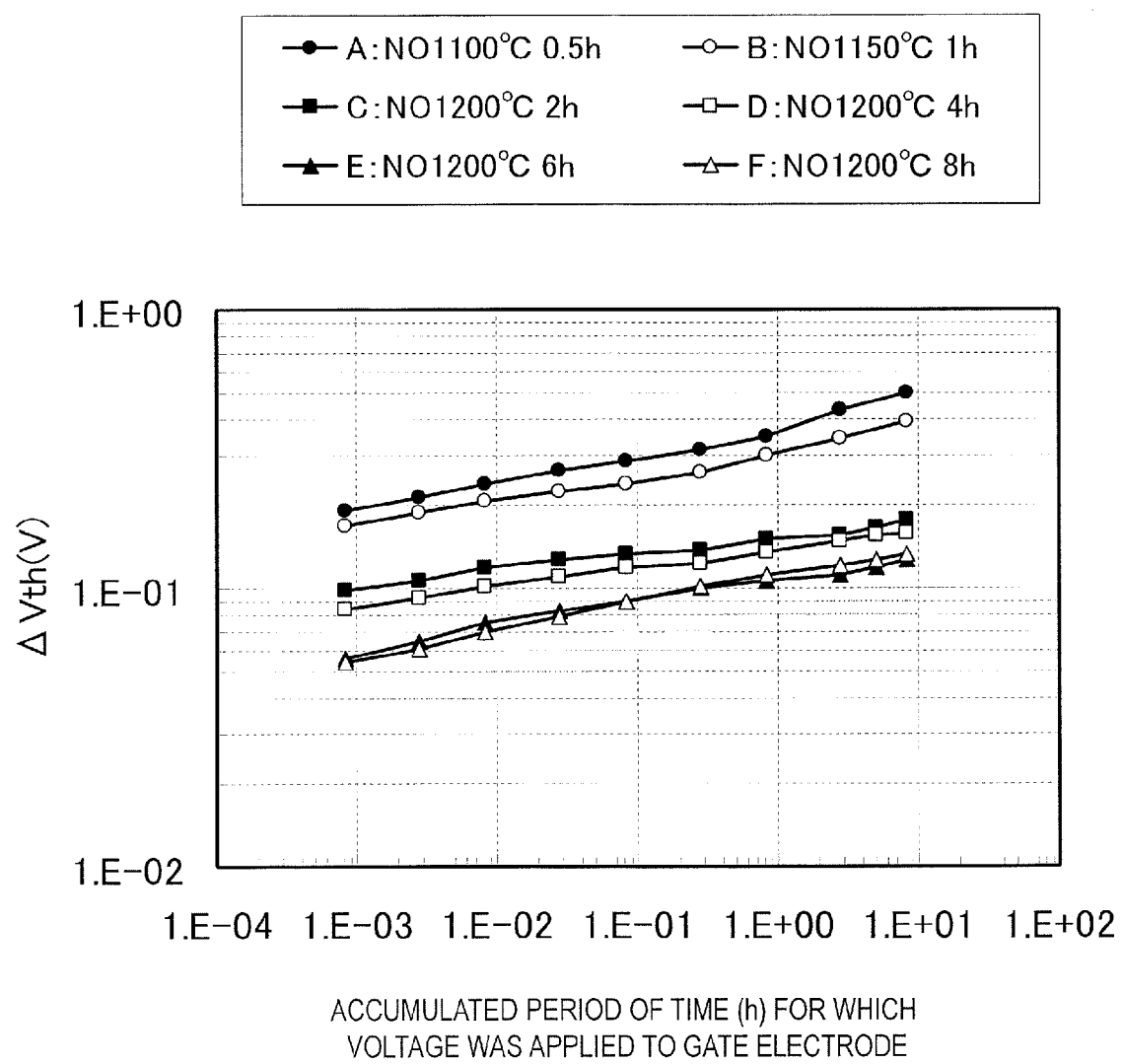
[FIG. 4] A graph showing the results of measurements of threshold value shifts ΔVth to be caused by applying a positive bias to the gate electrode, of which the abscissa represents the period of time for which a positive bias was applied and the ordinate represents the threshold value shift ΔVth.

FIG. 4 shows the estimated shifts in the threshold voltage of the respective samples. In FIG. 4, the ordinate represents the shift ΔVth from the threshold value Vth1 in the initial state while the abscissa represents the accumulated period of time for which the voltage was applied to the gate electrode.

As can be seen from FIG. 4, in each of the samples, as the accumulated period of time for which the voltage was applied to the gate electrode increased, the shift ΔVth also increased. Also, the higher the temperature of the nitridation process, the smaller the shift ΔVth. On the other hand, at the same temperature, the longer the nitridation process, the smaller the shift ΔVth. Furthermore, the area nitrogen atom concentrations of the carbon transition layer of the respective samples turned out to increase in the order of Samples A through F. Thus, the present inventors discovered that the higher the nitrogen atom concentration, the more significantly the shift ΔVth in threshold voltage could be suppressed by applying a positive bias to the gate electrode.

The present inventors looked into the results of estimation shown in FIG. 4 with special attention paid to how the rate of shift in the threshold value of each sample tended to change to find that the rate of change (i.e., the gradient of the graph) of the shift to be caused by applying a stress voltage for a relatively long time and the rate of change of the shift to be caused by applying a stress voltage for a relatively short time had mutually different trends. This would mean that the shift in threshold value to be caused after a relatively long time has passed since the stress voltage started to be applied and the shift in threshold value to be caused within a relatively short time since the stress voltage started to be applied should have mutually different mechanisms. That is to say, there are at least two mechanisms that would cause a shift in threshold value by applying a positive bias to the gate electrode. Thus, the present inventors studied those two factors that would cause such a shift in threshold value.

<Studied Factor #1 to Cause Threshold Value Shift: Interface State Density>

To study the mechanism by which the threshold value shift was reduced by introducing nitrogen, first of all, the present inventors measured the distribution of nitrogen atom concentrations in each of those samples to determine the relation between the nitrogen atom concentration and the threshold value shift.

Figure 6:
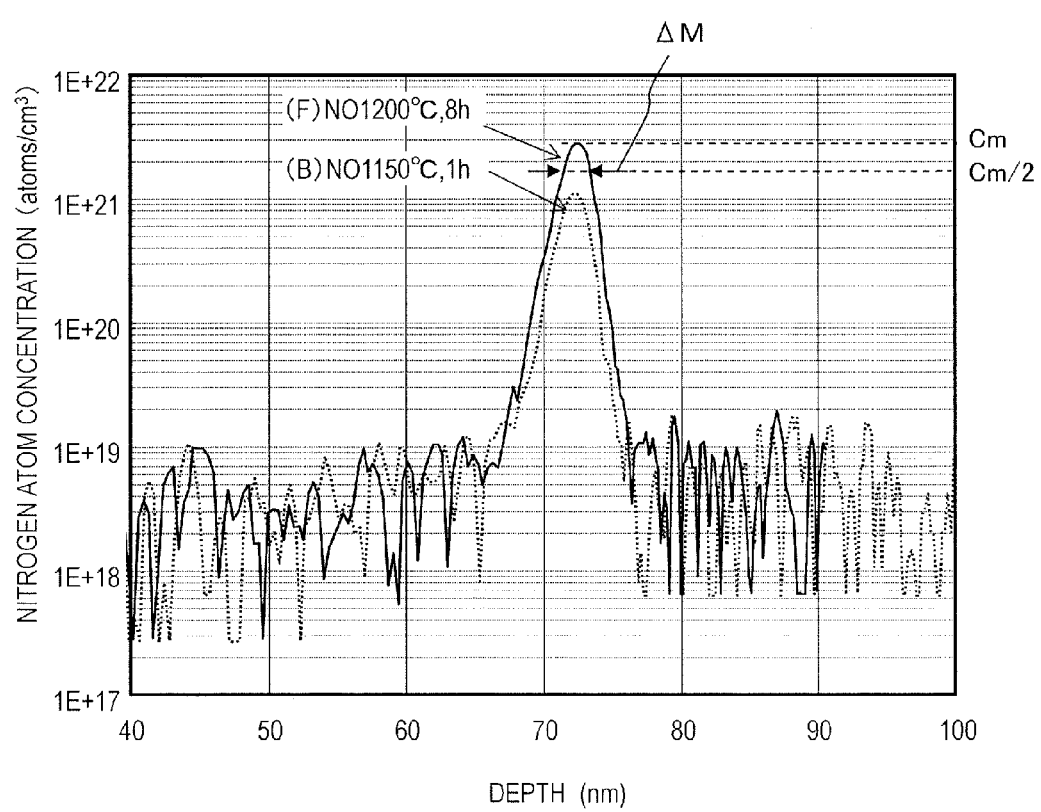
[FIG. 6] Shows the results of measurements of the nitrogen atom concentration profiles in the thickness direction of Samples B and F.

FIG. 6 is a graph showing the nitrogen atom distributions in the vicinity of the SiO$_2$/SiC interface in Sample B which is a typical sample with a large ΔVth and in Sample F which is a typical sample with a small ΔVth. It is generally known that nitrogen is distributed at a high concentration in the vicinity of an SiO$_2$/SiC interface that has been subjected to a nitridation process. In these samples, it was also confirmed that nitrogen atoms had been introduced to a high concentration into the vicinity of the SiO$_2$/SiC interface. Also, in these samples, the peak of the nitrogen atom concentration was located in the carbon transition layer. When the area nitrogen atom concentration in the carbon transition layer of Sample F was obtained and converted into the mass percentage of nitrogen included in the SiO$_2$ film, the result was approximately 5.9%. Since the SiO$_2$ film converted nitrogen atom concentration as reported in documents is approximately 3%, the present inventors discovered that nitrogen with a higher concentration than usual had been introduced into Sample F.

Figure 7:
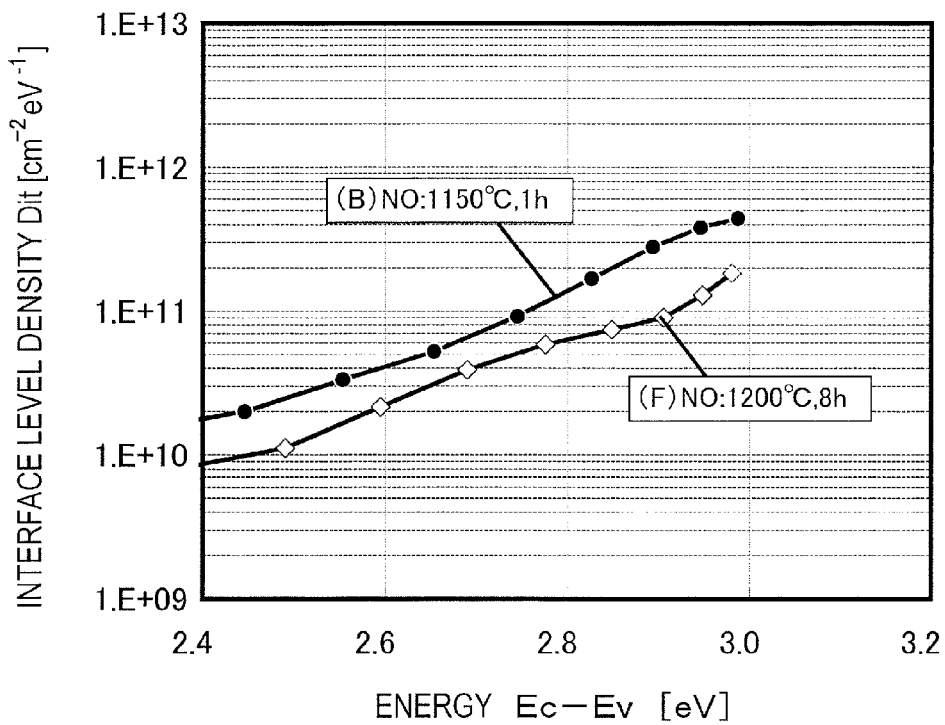
[FIG. 7] Shows the results of measurements of the interface state densities in the vicinity of the conduction band edge of Samples B and F.

The present inventors measured the energy distributions of the interface state densities in the vicinity of the band end of the conduction band in those Samples B and F described above. The results are shown in FIG. 7, of which the abscissa represents the difference between the energy Ec at the lower end of the conduction band and the energy Ev at the upper end of the valence band and the ordinate represents the interface state density Dit. As it was difficult to measure the interface state density using the vertical MOSFET shown in FIG. 1, the interface state density was estimated using an MOS capacitor with an area of 0.1 mm$^2$ which had been fabricated under the same condition as each sample. To suppress the influence of carrier traps on the voltage applied to the gate, the voltage to be applied to the gate electrode at a rate of 0.1 V/s was changed from 15 V into −15 V. And high-frequency CV (at 100 kHz) and quasi-static CV were measured at the same time. And an interface state density was calculated based on their difference (which is called a "High-Low method").

As shown in FIG. 7, the interface state density of Sample F is lower than that of Sample B. Thus, the present inventors discovered that if the nitrogen atom concentration was increased in the vicinity of the SiO$_2$/SiC interface, the interface state density could be decreased. Consequently, the present inventors confirmed that one of the factors to cause the threshold value variation was an increase in interface state density.

<Studied Factor #2 to Cause Threshold Value Shift: Residual Carbon>

As described above, the results shown in FIG. 4 reveal that there are at least two factors to cause the threshold value shift, one of which should be an increase in interface state density. Thus, the present inventors calculated ΔVth(h) by a model equation on the supposition that there should be a correlation between the interface state density and the threshold voltage shift ΔVth. It should be noted that the interface state density for use to calculate ΔVth(h) was obtained by the following equation:

$$\text{Nit}(t) = A \cdot E^m \cdot \exp(-\phi/kT) \cdot t^n$$

where A is a constant, E is an electric field, m is the exponent of the electric field dependence, φ is the activating energy, k is the Boltzmann constant, T is the absolute temperature, t is the time, and n is the exponent of the time dependence.

Next, by comparing ΔVth(h) thus calculated to the behavior of actual ΔVth, the present inventors studied another factor that would cause a shift in threshold voltage.

Figure 5:
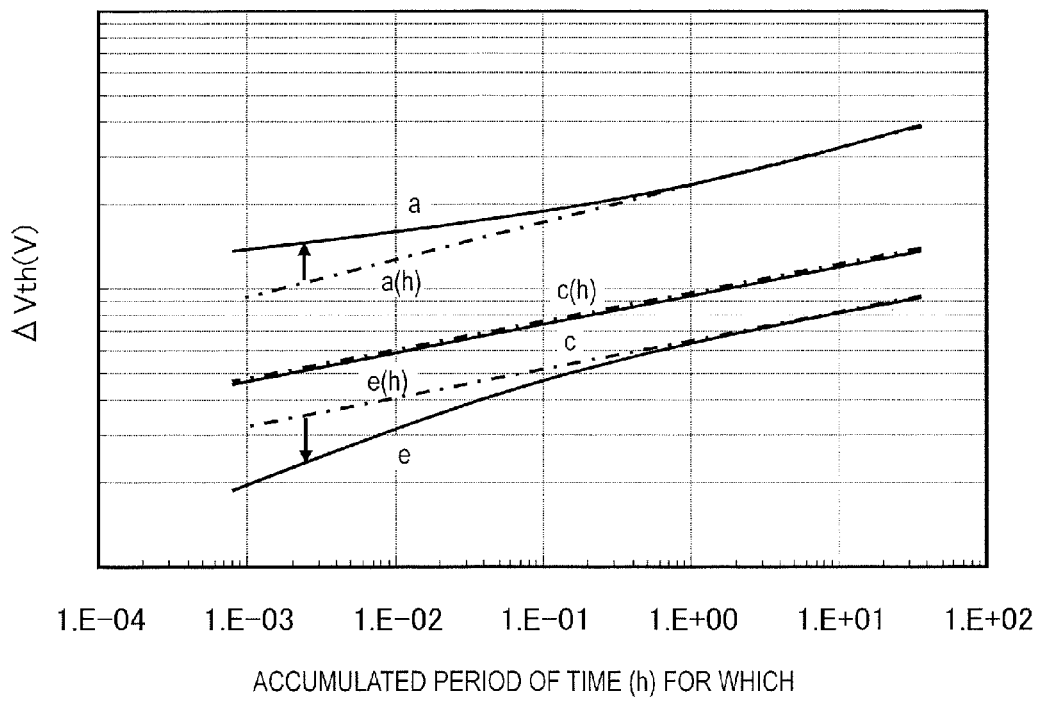
[FIG. 5] Schematically shows a factor of the threshold value shift caused by applying a positive bias to the gate electrode.

Now, take at a look at the modelling diagram shown in FIG. 5, in which the curve a schematically shows the results obtained from Samples A and B, the curve c schematically shows the results obtained from Samples C and D, and the curve e schematically shows the results obtained from Samples E and F. Also, the additional curves a(h), c(h) and e(h) associated with those curves show the behaviors of the threshold voltage shift ΔVth(h) that was calculated on the supposition that the threshold voltage would increase as the interface state density increased.

As can be seen from FIG. 5, the behavior of ΔVth observed in a relatively long time (e.g., more than 300 seconds) after a stress voltage started to be applied is substantially equal to that of ΔVth(h) (which is represented by the curves a(h), c(h) and e(h)). Thus, the threshold value shift would have been caused after a long time had passed due to an increase in interface state density in the vicinity of the interface between the silicon carbide semiconductor layer 102 and the silicon oxide film 104a as already described with reference to FIGS. 6 and 7.

On the other hand, the threshold voltage shift would have been caused shortly after the stress voltage started to be applied by a mechanism that had never been known in the prior art. For example, as for the curve a, the magnitude ΔVth of the threshold value shift (i.e., the initial shift) shortly (e.g., within 300 seconds) after the stress voltage started to be applied includes not only ΔVth(h) of the curve a(h) but also an additional shift as well. It can be seen that the additional shift was brought about due to another factor other than the interface state density. In the curve e, on the other hand, the magnitude ΔVth of the initial shift is smaller than ΔVth(h) of the curve e(h). As can be seen, in Samples A and B, there was a relatively significant initial shift due to an additional factor other than the increase in interface state density. In Samples C and D, on the other hand, the initial shift decreased compared to Samples A and B. And in Samples E and F, shallow levels contributing to the initial shift decreased and the initial shift further decreased.

The present inventors carried out an intensive research on the factors and mechanism of the initial shifts. As a result, we reached a conclusion that those shifts would have been caused due to the presence of residual carbon atoms. More specifically, the threshold value shifts would have been caused due to defect levels (or traps) that had been formed by those residual carbon atoms that should be present over a region of several nm at an unstable MOS interface that had been produced during the oxidation process. By further enhancing the nitridation process condition and by introducing at least a predetermined quantity of nitrogen atoms with respect to the quantity of carbon atoms, the effect of replacing or terminating the residual carbon atoms with nitrogen can be achieved significantly. As a result, a more stabilized state could have been created for electrons and the initial shift in the threshold voltage would have been suppressed effectively.

Figure 8:
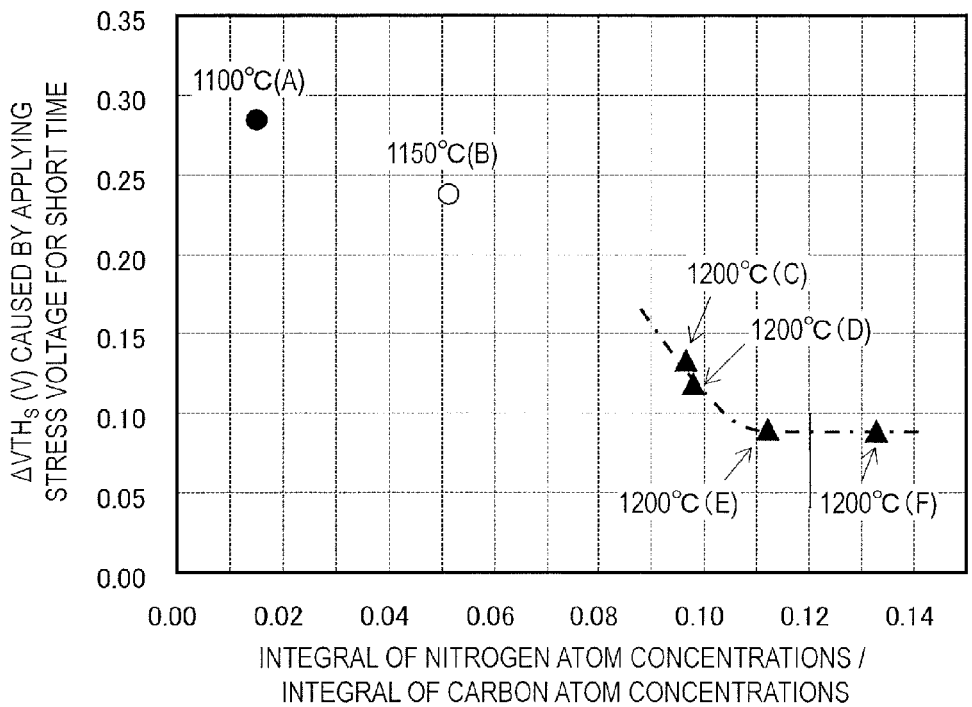
[FIG. 8] Shows a correlation between the ratio R of the integral of nitrogen atom concentrations to the integral of carbon atom concentrations and the threshold value shift $\Delta Vth_s$ due to the application of a positive bias for 300 seconds.

FIG. 8 shows a correlation between the ratio R of the concentration of nitrogen atoms to the concentration of carbon atoms which are present in the vicinity of the $SiO_2$/SiC interface of Samples A through F and the shift $\Delta Vth_s$ in Vth due to the application of a stress voltage for a short time. The ratio R of the nitrogen atom concentration represented by the abscissa was obtained by integrating the carbon and nitrogen atom concentrations that had been obtained by SIMS and then calculating the ratio of the integral of the nitrogen atom concentrations to that of the carbon atom concentrations (i.e., as (integral of nitrogen atom concentrations/integral of carbon atom concentrations)). The integration range of the respective atoms was supposed to be the atomic concentration integration region (see FIG. 2) in which the carbon atom concentration was 10% to 90% of the silicon carbide semiconductor (i.e., the carbon transition layer) and located closer to the silicon oxide film than the maximum value of the nitrogen atom concentration was. The shift $\Delta Vth_s$ represented by the ordinate is a shift in Vth to be caused when a stress voltage of +20 V is continuously applied for 300 seconds to the gate electrode within an ambient at a high temperature of 150° C.

As can be seen from FIG. 8, the larger the ratio R of the nitrogen atom concentration, the more significantly the shift $\Delta Vth_s$ in threshold voltage could be reduced. Also, if attention is paid to how the shifts $\Delta Vth_s$ of Samples C through F with a nitridation process temperature of 1200° C. changed, it can be seen that as the ratio R of the nitrogen atom concentration increased (i.e., as the nitridation process time increased), the shift $\Delta Vth_s$ decreased and that when the ratio R of the nitrogen atom concentration became equal to or greater than 0.11, the decrease in the shift $\Delta Vth_s$ got saturated as indicated by the chain curve in FIG. 8.

As can be seen from these results, the shift $\Delta Vth_s$ in threshold voltage to be caused by applying a stress voltage for a short time depends on not only the nitrogen atom concentration but also the concentration of carbon atoms (i.e., residual carbon atoms) in the vicinity of the $SiO_2$/SiC interface as well. The higher the ratio R of the nitrogen atom concentration, the more significantly the effect of replacing or terminating the defect levels (or traps) caused by the residual carbon atoms present in the carbon transition layer with nitrogen can be achieved and the smaller the shift $\Delta Vth_s$ becomes. If the quantity of nitrogen atoms becomes equal to or greater than a predetermined percentage of that of those residual carbon atoms (i.e., if the ratio R becomes equal to or greater than 0.11), the shift $\Delta Vth_s$ gets saturated and becomes substantially constant. Also, if the ratio R of the nitrogen atom concentration is equal to or greater than 0.11, the shift $\Delta Vth_s$ caused by applying a stress voltage for a short time can be decreased. And the shift caused by applying a stress voltage after that can also be reduced by that decrease. Consequently, the shift in threshold voltage can be reduced no matter how long the stress voltage is applied. The range of the quantity of nitrogen atoms to be introduced into the $SiO_2$/SiC interface to suppress the shift $\Delta Vth_s$ cannot be determined uniquely with respect to the silicon oxide film that has been formed in any of various manners but varies according to the quantity of carbon atoms that are present in the carbon transition layer.

The atomic concentration integration region (i.e., a depth range) to calculate the ratio R was set to be closer to the silicon oxide film than the peak of the nitrogen atom concentration was for the following reasons.

As there are residual carbon atoms over the entire carbon transition layer, the whole carbon transition layer could be set to be the atomic concentration integration region. In that case, however, the carbon atom concentration will be so much higher than the nitrogen atom concentration that sometimes it is difficult to measure the ratio of the nitrogen atom concentration accurately. As a result, it will be difficult to check out the relation between the ratio of the nitrogen atom concentration and the threshold value shift and suppress the threshold value shift. For that reason, the ratio R of the nitrogen atom concentration was obtained with a region of the carbon transition layer with a relatively low carbon atom concentration defined to be the atomic concentration integration region. It should be noted that at a peak of the nitrogen atom concentration, the correlation between carbon and nitrogen should manifest itself most sensibly. The reason is that if there are any localized nitrogen atoms, it means that there are the largest number of defect levels (or traps) there. For that reason, in the example described above, the atomic concentration integration region of the carbon transition layer was set with respect to the peak of the nitrogen atom concentration.

The upper limit of the ratio R of the nitrogen atom concentration is not particularly limited but may be 0.18 or less, for example. Also, if the area nitrogen atom concentration in the carbon transition layer were too high, the carriers would be scattered so much as to cause a decrease in mobility. That is why the area nitrogen atom concentration of the carbon transition layer is suitably limited to $1 \times 10^{15}$ cm$^{-2}$ or less. On the other hand, if the area nitrogen atom concentration in the carbon transition layer is equal to or greater than $6 \times 10^{14}$ cm$^{-2}$, for example, then the interface state density can be further reduced, and therefore, the shift $\Delta$Vth in threshold voltage due to the application of a stress voltage for a long time can be reduced more effectively. Consequently, the shifts $\Delta$Vth in threshold voltage caused by applying a stress voltage for a short time and for a long time can be reduced more effectively, and the expected effect can be achieved more significantly.

The area carbon atom concentration in the carbon transition layer also varies according to the method, condition and materials to form the silicon carbide semiconductor layer and the silicon oxide film, and therefore, is not limited, either. For example, if a silicon oxide film is formed by thermally oxidizing a silicon carbide layer which has been grown epitaxially, the area carbon atom concentration of the carbon transition layer may fall within the range of $6 \times 10^{15}$ cm$^{-2}$ to $1 \times 10^{16}$ cm$^{-2}$.

<Peak Value Cm and Half Width $\Delta$M of Nitrogen Atom Concentration Profile>

The present inventors obtained a peak value Cm and a half width $\Delta$M based on the nitrogen atom concentration profile in the depth direction with respect to the respective Samples B through F. Hereinafter, it will be described what values we obtained and how. The half width $\Delta$M is the width of a region where there are nitrogen atoms at least one half as high a concentration as the peak value Cm of the nitrogen atom concentration.

Take Sample F, for example. The nitrogen atom concentration profile in the depth direction is obtained by SIMS in the vicinity of the interface between the silicon oxide film and the silicon carbide semiconductor layer of Sample F. In this example, the nitrogen atom concentration was measured by SIMS using oxygen ions as primary ions.

Next, based on the nitrogen atom concentration profile obtained by SIMS (see FIG. 6), a peak value (or peak concentration) Cm and half width ΔM of the nitrogen atom concentration are obtained. As shown in FIG. 6, the width ΔM of the depth between two points at which the concentration becomes a half of the peak value Cm (i.e., Cm/2) is the half width.

The peak values Cm and half widths ΔM of the other samples were obtained in the same way. The results thus obtained are shown in the following Table 2:

TABLE 2

| Sample | NO treatment condition Temperature (° C.) | Time (h) | Peak value Cm (atms/cm$^3$) of nitrogen atom concentration | Half width Δm (nm) |
|---|---|---|---|---|
| B | 1150 | 1 | $1.09 \times 10^{21}$ | 2.0 |
| C | 1200 | 2 | $2.13 \times 10^{21}$ | 2.1 |
| D | 1200 | 4 | $2.25 \times 10^{21}$ | 2.2 |
| E | 1200 | 6 | $2.57 \times 10^{21}$ | 2.4 |
| F | 1200 | 8 | $2.83 \times 10^{21}$ | 2.3 |

As can be seen from these results, if the NO treatment time was equal to or shorter than six hours, the longer the NO treatment time, the more significantly the half width ΔM increased. In Samples E and F with small shifts ΔVth in threshold voltage, the half width ΔM is 2.3 nm or more, for example.

If the half width ΔM is large, the following advantages can be obtained. As described above, in a conventional semiconductor device, there are residual carbon atoms over a region of several nm at an MOS interface. Such a region will be referred to herein as a "residual carbon region", in which the residual carbon atoms are present at a concentration of $1.0 \times 10^{19}$ cm$^{-3}$ or more, for example. If the half width ΔM of the nitrogen atom concentration profile is small, the residual carbon region may include a region that lacks nitrogen atoms. That is why the threshold value could vary due to the presence of defect levels caused by residual carbon atoms that have not been replaced or terminated with nitrogen atoms. However, if the half width ΔM is increased (to about 2.3 nm or more, for example), those residual carbon atoms can be replaced or terminated with nitrogen atoms more securely over the residual carbon region. As a result, the threshold value shift due to the presence of defect levels that have been caused by the residual carbon atoms can be suppressed even more effectively.

The silicon carbide semiconductor device of this embodiment does not have to be implemented as a vertical MOSFET such as the one shown in FIG. 1(b). The MOSFET of this embodiment may have no channel layers. In that case, the gate insulating layer (silicon oxide film) may be arranged so as to contact with the surface of the body region and the drift region.

Furthermore, this embodiment is also applicable to various kinds of semiconductor devices with a structure (MOS structure) in which an electrode is arranged on a silicon carbide semiconductor layer with an insulating film interposed between them. For example, this embodiment is also applicable to a lateral MOSFET as will be described later.

Figure 9:
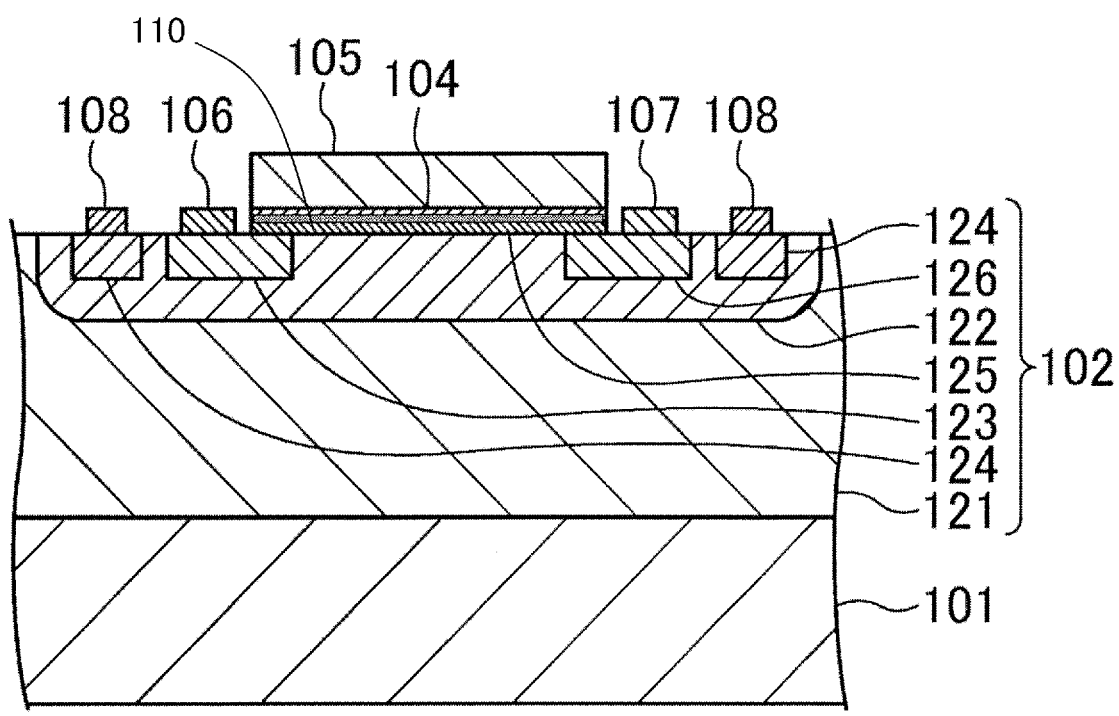
[FIG. 9] A cross-sectional view illustrating a silicon carbide semiconductor device (as a lateral MOSFET) according to another embodiment of the present invention.

FIG. 9 is a cross-sectional view illustrating a lateral MOSFET. In the lateral MOSFET shown in FIG. 9, a source electrode 106 and a drain electrode 107 are arranged on a silicon carbide semiconductor layer 102. Optionally, the lateral MOSFET may further include a contact electrode 108 on the silicon carbide semiconductor layer 102.

The silicon carbide semiconductor layer 102 includes a drift region 121 of a first conductivity type (e.g., n$^-$ type in this example), a body region 122 of a second conductivity type (e.g., p-type in this example) which is arranged adjacent to the drift region 121, and a channel layer 125 which is arranged between the body region 122 and the silicon oxide film 104a. A carbon transition layer 110 is arranged between the channel layer 125 and the silicon oxide film 104a.

In the body region 122, a first doped region 123 of the first conductivity type (e.g., n$^+$ type in this example), which will be sometimes referred to herein as a "source region", and a second doped region 126 of the first conductivity type (e.g., n$^+$ type in this example), which will be sometimes referred to herein as a "drain region", are arranged so as to be spaced apart from each other. In this example, the source region 123 and the drain region 126 are arranged on right- and left-hand sides of a gate electrode 105 so as to interpose the gate electrode 105 between them. The channel layer 125 is arranged so as to connect the first and second doped regions 123 and 126 together. The source electrode 106 is electrically connected to the first doped region 123. And the drain electrode 107 is electrically connected to the second doped region 126.

Although the source and drain electrodes 106 and 107 and the contact electrode 108 are arranged independently of each other in the example illustrated in FIG. 9, the source and drain electrodes 106 and 107 and the contact electrode 108 may also be formed integrally as in the structure shown in FIG. 1(b).

Even though the first conductivity type is supposed to be n type and the second conductivity type is supposed to be p type in each of the embodiments described above, the n- and p-type regions may be changed with each other.

Furthermore, the embodiments described above are applicable to a MOSFET with a gate trench. Furthermore, the present invention is also applicable to a silicon carbide semiconductor device other than a MOSFET. Although a MOSFET is supposed to be fabricated using a substrate 101 of the same conductivity type as the drift region 121 in the embodiments described above, an insulated gate bipolar transistor (IGBT) may also be fabricated using a silicon carbide substrate of a different conductivity type from the drift region 121.

INDUSTRIAL APPLICABILITY

According to embodiments of the present invention, not only the channel mobility can be increased but also the reliability can be increased significantly by suppressing the threshold value shift when a positive bias is applied to the gate electrode. Thus, the present invention is applicable effectively to various kinds of silicon carbide semiconductor devices such as a power device.

The present invention is broadly applicable to various kinds of silicon carbide semiconductor devices with an MOS structure such as a MOSFET and an IGBT.

REFERENCE SIGNS LIST 101 substrate
102 silicon carbide semiconductor layer
104 gate insulating layer
104a silicon oxide film
105 gate electrode
106 source electrode
107 drain electrode
108 contact electrode
110 carbon transition layer
121 drift region
122 body region
123 source region
124 contact region
125 channel layer
126 drain region

The invention claimed is:

1. A method for fabricating a silicon carbide semiconductor device, the method comprising the steps of:
  (a) providing a silicon carbide semiconductor layer;
  (b) forming a gate insulating layer including a silicon oxide film on the surface of the silicon carbide semiconductor layer, whereby a carbon transition layer, which has a carbon atom concentration is 10% to 90% of a carbon atom concentration of the silicon carbide semiconductor layer, is formed between the silicon carbide semiconductor layer and the silicon oxide film; and
  (c) introducing nitrogen atoms into at least the carbon transition layer, whereby in a region of the carbon transition layer which is located closer to the silicon oxide film than a position where a nitrogen atom concentration reaches its peak is, a ratio of an integral of nitrogen atom concentrations to an integral of carbon atom concentrations is equal to or greater than 0.11.

2. The method of claim 1, wherein the step (b) includes forming the silicon oxide film by thermally oxidizing the surface of the silicon carbide semiconductor layer.

3. The method of claim 1, wherein the step (c) includes conducting a heat treatment at a temperature of at least 1200° C. within an ambient including nitrogen on the silicon carbide semiconductor layer on which the gate insulating layer has been formed.

4. A silicon carbide semiconductor device comprising:
  a silicon carbide semiconductor layer;
  a gate insulating layer which is arranged over the silicon carbide semiconductor layer and which includes a silicon oxide film;
  a gate electrode which is arranged on the gate insulating layer; and
  a carbon transition layer which is interposed between the silicon carbide semiconductor layer and the silicon oxide film and which has a carbon atom concentration of 10% to 90% of a carbon atom concentration of the silicon carbide semiconductor layer, and
  wherein in a region of the carbon transition layer which is located closer to the silicon oxide film than a position where a nitrogen atom concentration becomes the highest is, a ratio of an integral of nitrogen atom concentrations to an integral of carbon atom concentrations is equal to or greater than 0.11.

5. The silicon carbide semiconductor device of claim 4, further comprising a substrate which supports the silicon carbide semiconductor layer, a drain electrode which is arranged on the other side of the substrate opposite from the silicon carbide semiconductor layer, and a source electrode which is arranged on the silicon carbide semiconductor layer,
  wherein the silicon carbide semiconductor layer includes: a drift region of a first conductivity type; a body region of a second conductivity type which is arranged adjacent to the drift region; a doped region of the first conductivity type which is arranged in the body region; and a channel layer which is arranged between the body region and the gate insulating layer so as to connect the drift region and the doped region together,
  the source electrode is electrically connected to the doped region, and
  the carbon transition layer is located between the channel layer and the silicon oxide film.

6. The silicon carbide semiconductor device of claim 4, further comprising a substrate which supports the silicon carbide semiconductor layer, and source and drain electrodes which are arranged on the silicon carbide semiconductor layer,
  wherein the silicon carbide semiconductor layer includes: a drift region of a first conductivity type; a body region of a second conductivity type which is arranged adjacent to the drift region; first and second doped regions of the first conductivity type which are arranged in the body region so as to be spaced part from each other; and a channel layer which is arranged between the body region and the gate insulating layer so as to connect the first and second doped regions together,
  the source and drain electrodes are electrically connected to the first and second doped regions, respectively, and
  the carbon transition layer is located between the channel layer and the silicon oxide film.

7. The semiconductor device of claim 4, wherein a depth direction profile of the nitrogen atom concentration has a peak in the carbon transition layer.

* * * * *